United States Patent [19]

Takacs et al.

[11] Patent Number: 5,045,716

[45] Date of Patent: Sep. 3, 1991

[54] INTEGRATED CIRCUIT IN COMPLEMENTARY CIRCUIT TECHNOLOGY COMPRISING A SUBSTRATE BIAS VOLTAGE GENERATOR

[75] Inventors: Dezsö Takacs, Munich; Josef Winnerl, Landshut, both of Fed. Rep. of Germany

[73] Assignee: Siemens Aktiengesellschaft, Munich, Fed. Rep. of Germany

[21] Appl. No.: 314,251

[22] Filed: Feb. 23, 1989

Related U.S. Application Data

[63] Continuation of Ser. No. 895,308, Aug. 11, 1986, abandoned.

[30] Foreign Application Priority Data

Aug. 26, 1985 [DE] Fed. Rep. of Germany ....... 3530427

[51] Int. Cl.⁵ .................... H03K 3/013; H03K 17/16; H01L 27/10; H01L 27/04
[52] U.S. Cl. .............. 307/296.2; 307/303.2; 357/23.6; 357/42
[58] Field of Search ............ 307/296.2, 296.5, 303.2; 357/23.6, 41, 42

[56] References Cited

U.S. PATENT DOCUMENTS

| | | | |
|---|---|---|---|
| 3,845,331 | 10/1974 | Luscher | 357/23.6 |
| 4,463,270 | 7/1984 | Gordon | 307/200 B |
| 4,473,758 | 9/1984 | Huntington | 307/296 R |
| 4,556,204 | 12/1985 | Dewitt | 327/200 B |
| 4,622,573 | 11/1986 | Bakeman et al. | 351/42 |
| 4,705,966 | 11/1987 | Van Zanten | 307/296.2 |
| 4,710,647 | 12/1987 | Young | 307/296.2 |
| 4,791,316 | 12/1988 | Winnerl et al. | 307/296.2 |
| 4,791,317 | 12/1988 | Winnerl et al. | 307/296.2 |
| 4,798,974 | 1/1989 | Reczek et al. | 357/23.6 X |

FOREIGN PATENT DOCUMENTS 56-83962 7/1981 Japan ................... 359/23.6

OTHER PUBLICATIONS

"Voltage Regulator Circuit for CMOS Substrate Voltage Generator", IBM Tech. Discl. Bull., vol. 28, No. 3, pp. 1287–1288, Aug. 1985.

Primary Examiner—Stanley D. Miller
Assistant Examiner—David R. Bertelson
Attorney, Agent, or Firm—Hill, Van Santen, Steadman & Simpson

[57] ABSTRACT

An integrated circuit in complementary circuit technology comprises a substrate bias voltage generator which reverse biases the substrate, into which tubs of opposite conductivity are inserted. The source regions of the field effect transistors arranged in the substrate lie at ground potential. In order to avoid "latch-up" effects, the output of the substrate bias voltage generator is connected by way of an electronic switch to a circuit point lying at ground potential, whereby the switch is driven via the output of the substrate bias voltage generator.

15 Claims, 2 Drawing Sheets

INTEGRATED CIRCUIT IN COMPLEMENTARY CIRCUIT TECHNOLOGY COMPRISING A SUBSTRATE BIAS VOLTAGE GENERATOR

This is a continuation of application Ser. No. 06/895,308, filed Aug. 11, 1986, now abandoned.

BACKGROUND OF THE INVENTION

The present invention relates to an integrated circuit in complementary circuit technology comprising a substrate bias voltage generator in which field effect transistors of different channel types are provided, at least one of which field effect transistors is arranged in a doped semiconductor substrate of a first conductivity type and at least one second field effect transistor is arranged in a tub-shaped semiconductor zone of a second conductivity type in the semiconductor substrate, whereby the semiconductor zone is connected to a voltage supply and a terminal region of at least one first field effect transistor is charged with a ground potential and the semiconductor substrate is connected to the output of a substrate bias voltage generator to which the ground potential and the supply voltage are supplied and which biases the pn junction between the terminal region of the first field effect transistor lying at ground potential and the semiconductor substrate in the reverse direction.

2. Description of the Prior Art

Given circuits of the type set forth above, the semiconductor substrate does not lie at the ground potential $V_{SS}$ of the circuit, but at a substrate bias voltage $V_{BB}$ which is generated by way of a substrate bias voltage generator. Given a semiconductor substrate composed of p-conductive material which is provided with an inserted n-conductive, tub-shaped semiconductor zone, a negative substrate bias voltage of about $-2$ to $-3$ volts is applied. The source regions of field effect transistors which are provided on the semiconductor substrate outside of the tub-shaped semiconductor zone are thereby applied to the ground potential $V_{SS}$.

At the moment the positive supply voltage $V_{DD}$ is switched on, the p-conductive semiconductor substrate is initially in a "floating" state in which it is disconnected from external potentials. It can thereby be temporarily charged to a positive bias voltage via depletion layer capacitances which are present, first, between the tub-shaped semiconductor zone and the substrate and, second, between the source regions lying on ground potential and the substrate, the positive bias voltage remains until the substrate bias voltage generator takes effect and it is replaced by the negative substrate bias voltage being gradually built up at the output thereof. During operation of the integrated circuit as well, however, larger currents which are sinked from the semiconductor substrate via the substrate bias voltage generator to a terminal of the latter lying at ground potential can lead to a positive bias voltage of the semiconductor substrate due to the voltage drop at the internal resistance of the substrate bias voltage generator. Positive bias voltages, however, represent a high safety risk for the integrated circuit since a "latch-up" effect can be triggered, this usually meaning the failure of the integrated circuit.

In order to understand the "latch-up" effect, it can be assumed that four successive semiconductor layers of alternating conductivity types are generally present between a terminal of a field effect transistor of the first channel type lying in the tub-shaped semiconductor zone and a terminal of a field effect transistor of the second channel type located outside of this zone on the semiconductor substrate, whereby the one terminal region of the first transistor forms the first semiconductor layer, the tub-shaped semiconductor zone forms the second semiconductor layer, the semiconductor substrate forms the third and the one terminal region of the second transistor forms the fourth semiconductor layer. Given a positive bias voltage of the semiconductor substrate, the pn junction between the third and fourth semiconductor layers can be biased to such a degree in the conducting direction that a current path arises between the mentioned transistor terminal, this being attributable to a parasitic thyristor effect within the four-layer structure. The current path then also remains after the positive substrate bias voltage disappears and can thermally overload the integrated circuit.

SUMMARY OF THE INVENTION

The object of the present invention is to provide a circuit of the type set forth above wherein the appearance of "latch-up" effects is largely avoided. This is achieved, according to the invention, by constructing the circuit such that it is characterized in that the output of the substrate bias voltage generator is connected via an electronic switch to a circuit point lying at ground potential, and in that the electronic switch is driven via the output of the substrate bias voltage generator.

The advantage obtainable in practicing the present invention is particularly that a bias voltage of undesired polarity lying at the semiconductor substrate which can trigger a "latch-up" effect is limited with simple structure to a value which makes this risk impossible.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
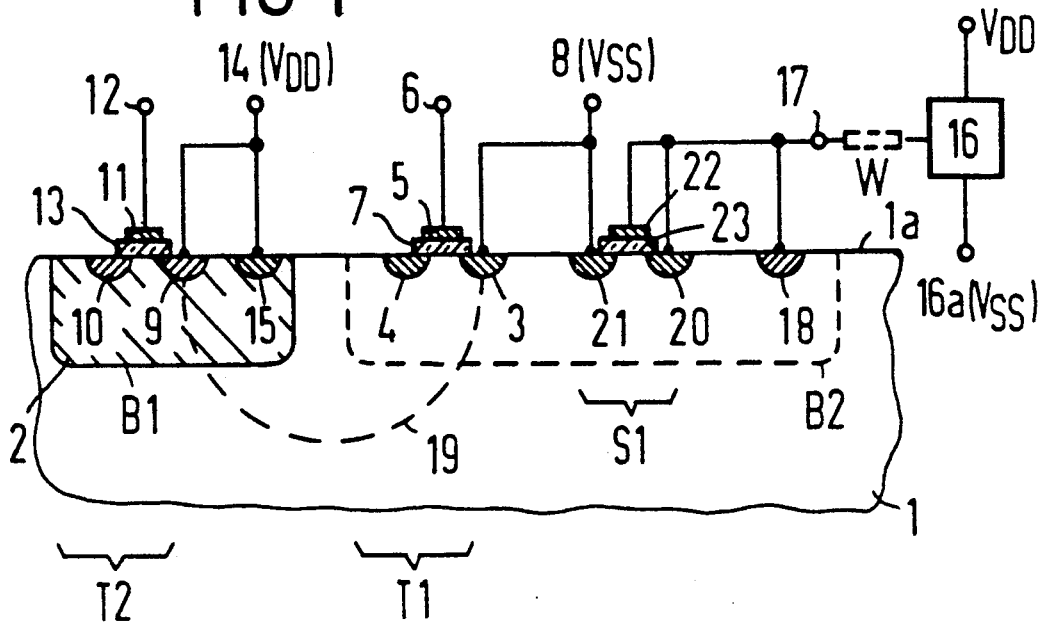
FIG. 1 is a fragmentary sectional view of an integrated circuit constructed in accordance with the present invention.

Referring to FIG. 1, an integrated circuit constructed in accordance with a first embodiment of the invention is illustrated as comprising a semiconductor substrate 1 of doped semiconductor material, for example p-conductive silicon. The substrate 1 comprises an n-conductive, tub-shaped semiconductor zone 2 which extends up to the boundary surface 1a of the substrate 1. Inserted into the substrate outside of the semiconductor zone 2 are n+ doped semiconductor regions 3 and 4 which form the source and the drain region of an n-channel field effect transistor T1. The channel region lying between the regions 3 and 4 is covered by a gate 5 which is provided with a terminal 6 and is separated from the boundary surface 1a by a thin electrically-insulating layer 7 of, for example, $SiO_2$. The source region 3 is connected to a terminal 8 which lies at ground potential $V_{SS}$. Further inserted into the semiconductor zone 2 are p+ doped regions 9 and 10 which represent the source region and the drain region of a p-channel field effect transistor T2. The channel region lying between the regions 9 and 10 is covered by a gate 11 which is provided with a terminal 12 and is separated from the boundary surface 1a by a thin electrically insulating layer 13 of, for example, $SiO_2$. The source region 9 of the transistor T2 is connected to a terminal 14 which is connected to a supply potential $V_{DD}$. The semiconductor zone 2 lies at the supply voltage $V_{DD}$ via an n+ doped contact region 15 which is connected to the terminal 14.

A substrate bias voltage generator 16 is also provided, this generating a negative substrate bias voltage of, for example, −2 to −3 volts. The output 17 of the substrate bias voltage generator is connected to a p+ doped contact region 18 which is inserted into the semiconductor substrate 1. The semiconductor substrate 1 is therefore located at the negative substrate bias voltage generated by the generator 16, whereas the source region, for example the region 3, of the transistors, for example the transistor T1, located in the semiconductor substrate 1 are at ground potential $V_{SS}$. Included among things thereby achieved is that the depletion layer capacitances of the source regions of the transistors arranged in the substrate 1 are diminished.

In order to avoid a "latch-up" effect which could occur within the four-layer structure 3, 1, 2 and 9 lying along the broken line 19 between the terminals 8 and 14, the output 17 of the substrate bias voltage generator 16 is connected via an electronic switch S1 to a circuit point which lies at ground potential. In the illustrated exemplary embodiment, this circuit point is the terminal 8. In detail, the output 17 in the arrangement of FIG. 1 is connected to an n+ doped semiconductor region 20 which is inserted into the semiconductor substrate 1. A further n+ doped semiconductor region 21 is inserted into the semiconductor substrate 1 and is connected to the circuit point lying at ground potential, i.e. particularly to the terminal 8. The region of the semiconductor substrate 1 lying between the regions 20 and 21 is covered by a gate 22 which is separated from the boundary surface 1a by a thin electrically-insulating layer 23 of, for example, $SiO_2$. The regions 20 and 21 together with the elements 22 and 23 form an n-channel field effect switching transistor which represents the electronic switch S1. The drive of the switch S1 occurs via the output 17 of the substrate bias voltage generator 16. For this purpose, the gate 22 in FIG. 1 is directly connected to the output 17.

The switching transistor 20-23 in FIG. 1 should have a low threshold voltage which is smaller than the forward bias voltage of the pn junction between the elements 1 and 3. This can be achieved in a traditional manner, for example, in that that region of the substrate 1 lying between the regions 20 and 21 comprises no additional doping other than the fundamental doping which amounts to, for example, $10^{15}$ cm$^{-3}$, whereas the channel regions of the remaining field effect transistors, for example the transistor T1, are provided with an additional doping in the proximity of the boundary surface 1a, this additional doping reinforcing the basic doping and being advantageously introduced with a dose of about $10^{12}$ cm$^{-2}$ by way of implantation. When two different insulating layer thicknesses are available in the manufacturing technique employed, then the smaller is advantageously employed for the insulation 23, this amounting to, for example, 15 nm, whereas a thickness of about 20-25 nm is selected for the insulating layer 7 and 13.

When the semiconductor substrate 1 lies at a positive bias voltage, then the gate 22 is also correspondingly positively biased, this leading to the fact that when the low threshold voltage is exceeded that the switching transistor 20-23 becomes conductive. The voltage at the output 17 is therefore limited to the value of the low threshold voltage. For example, this clamping effect occurs when, by switching on the supply voltage $V_{DD}$, the semiconductor substrate 1 is boosted to a positive bias voltage by the capacitive voltage division between the terminals 14 and 8 as long as the generator 16 does not yet supply the full negative bias voltage. Only when the negative bias voltage begins to be subsequently built up at the output 17 does the switching transistor 20-23 inhibit when the bias voltage falls below the low threshold voltage, so that the described clamp effect is suppressed. When high currents derive during operation, these flowing off via the semiconductor substrate 1 and the elements 18, 17 and 16 to the terminal 16a which lies at ground potential $V_{SS}$, then such a voltage drop can occur at the internal resistor W of the generator 16 that the output 17 and, therefore, the semiconductor substrate 1 are at least temporarily placed at the positive bias voltage. In this case, also, the switching transistor 20-23 become conductive when the low threshold voltage is exceeded, so that the voltage at the output 17 is again limited to the value of the low threshold voltage. This clamp effect is suppressed as soon as a negative bias voltage again begins to be established at this substrate and, thereby, the low threshold voltage.

The substrate bias voltage generator 16 is advantageously co-integrated on the semiconductor substrate 1.

Figure 2:
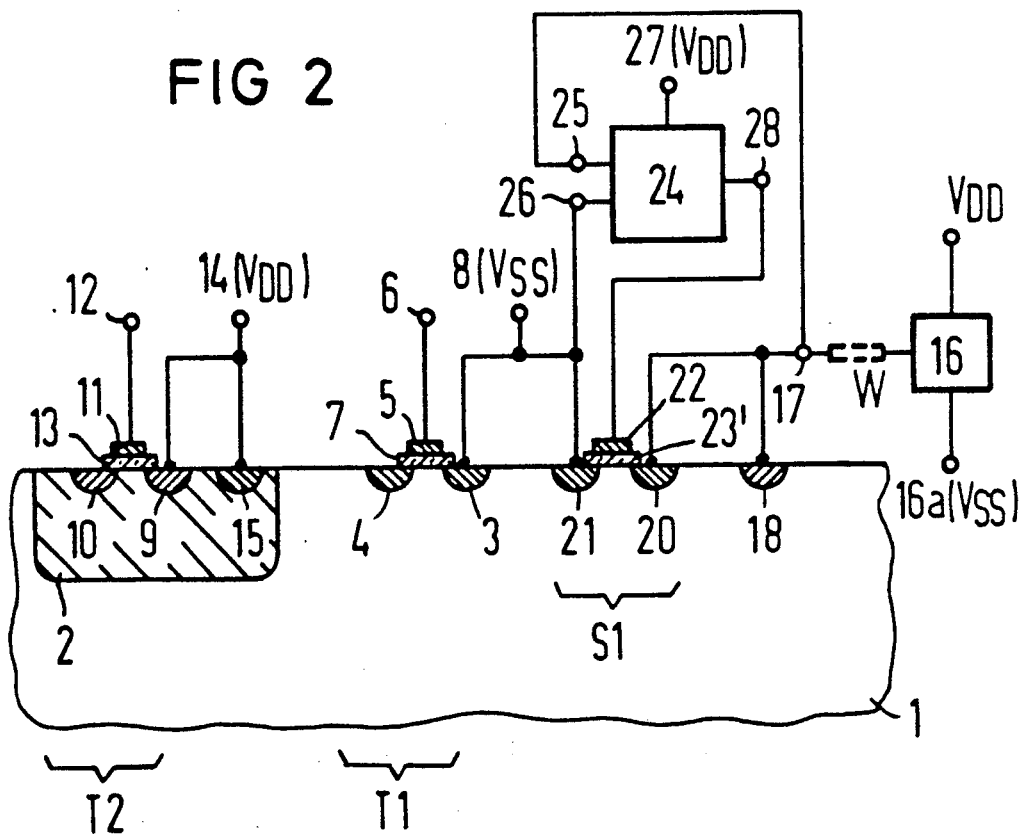
FIG. 2 is a fragmentary sectional view of an integrated circuit constructed in accordance with the second embodiment of the invention.

FIG. 2 shows a second exemplary embodiment of the invention which differs from FIG. 1 on the basis of a modified drive of the electronic switch S1. In detail, a comparator 24 having two inputs 25 and 26 is provided, whereby the input 25 is connected to the output 17 of the substrate bias voltage generator 16, whereas the input 26 is connected to the terminal 8 lying at ground potential. The comparator 24 is connected to the supply voltage $V_{DD}$ via a terminal 27. An output 28 of the comparator 24 is connected to the gate 22 of the electronic switch S1. The insulating layer beneath the gate 22 is referenced 23'.

The comparator 24 compares the voltage at the output 17 of the substrate bias voltage generator 16 to the ground potential $V_{SS}$. When a positive voltage which exceeds a threshold of the comparator 24 is at the output 17 and, therefore, at the semiconductor substrate 1, then a positive voltage is output via the output 28 of the comparator, this positive voltage switching the n-channel field effect transistor 20-23' conductive. The voltage at the output 17 is therefore limited to this threshold, as already mentioned, that can be the case given connection of the supply voltage $V_{DD}$ or when, during operation, higher currents flow via the elements 1, 18, 17 and 16 - - - 16a. When the negative bias voltage is again built up at the output 17 of the generator 16 after switching on of the supply voltage $V_{DD}$ or after the mentioned high currents have decayed and when, accordingly, a voltage which falls below the comparator threshold is applied to the input 25 of the comparator 24, then the comparator signal at the output 28 is switched off, whereby the transistor 20-23' or, respectively, the electronic switch S1 is off.

The exemplary embodiment of FIG. 2 further differs from that of FIG. 1 in that the electronic switch S1 need no longer be realized in the form of a switching transistor having a low threshold voltage, since the output voltage of the comparator 24 can be selected of such a magnitude that a threshold voltage which corresponds to that of the transistor T1, etc, guarantees the clamping effect. The layer 23' can therefore be constructed with a thickness of about 20–25 nm which is equivalent to the thickness of the layers 7 and 13. Also with respect to an auxiliary implantation in the channel region, the transistor 20–23' need no longer differ from the other transistor, for example the transistor T1.

Figure 3:
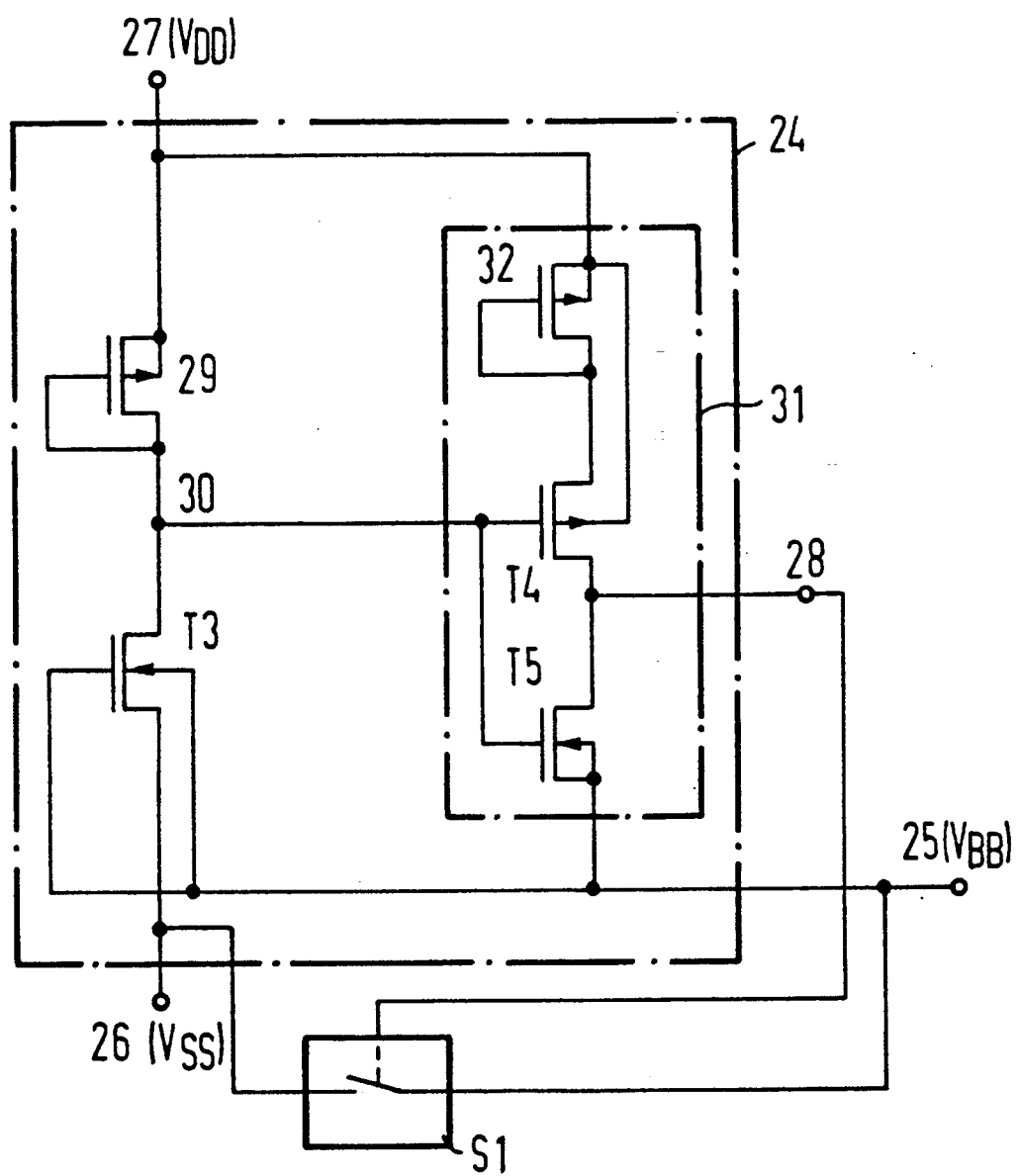
FIG. 3 is a schematic circuit diagram of a preferred embodiment of a comparator.

FIG. 3 illustrates the preferred embodiment of the comparator 24. A series circuit of an n-channel field effect transistor T3 and a load element 29 is provided which, in particular, is formed by a p-channel field effect transistor whose gate is connected to its drain terminal. The one terminal of the series circuit which simultaneously forms a terminal of the transistor 29 corresponds to the terminal 27 which is connected to the voltage $V_{DD}$ whereas the other terminal of the series circuit represents the input of the comparator connected to ground potential $V_{SS}$. The gate of the transistor T3 is connected to the input 25 of the comparator 24 which is charged with a potential $V_{BB}$. The common node 30 of the transistors T3 and 29 is connected to the output 28 of the comparator via an amplifier stage 31. The amplifier stage 31, constructed as an inverter, contains a series circuit of a p-channel field effect transistor T4 and an n-channel field effect transistor T5 whose gates are connected to the node 30. The upper terminal of the transistor T4 is connected to the terminal 27 via a load element 32. The lower terminal of the transistor T5 is connected to the input 25. The load element 32 is advantageously realized as a p-channel field effect transistor whose gate is connected to its drain terminal. The electronic switch S1 in accordance with FIG. 2 is connected between the inputs 25 and 26 of the comparator and, therefore, between the circuit points 17 and 8 (FIG. 2).

The transistor T3 exhibits a threshold voltage which is lower than the forward bias voltage of the pn junction between the elements 1 and 3 (FIG. 2). To this end, for example, it is realized in accordance with the transistor 20–23' without additional channel implantation and with a gate insulating layer exhibiting a thickness of only about 15 nm.

When a voltage which exceeds the low threshold voltage of the transistor T3 is applied to the input 25, then the transistor T3 become conductive. The potential at the point 30 is thereby lowered, this leading by way of the stage 31 to an increase of the potential at the output 28. As a result thereof, the switch S1, constructed as an n-channel switching transistor 20–23', is switched conductive, so that the clamping effect begins. When the substrate voltage drops below the value of the threshold voltage of the transistor T3, the switch S1 is inhibited so that the clamping effect is suppressed.

In a departure from the embodiments heretofore set forth, the electronic switch S1 can also be realized in some other manner, for example as a bipolar transistor which, in particular, is constructed as an external circuit element and is connected to the terminals 8 and 17 via connecting lines.

The low threshold voltage of the transistors 20–23 and T3 can also be achieved in a known manner by an appropriately dimensioned, auxiliary doping of their channel regions, whereby, however, an additional masking step is required in the manufacture of the circuit of the invention. In general, the gate insulating layer of these transistors is thereby dimensioned in accordance with that of the remaining transistors.

In addition to the embodiments discussed above, the invention also encompasses embodiments wherein n-conductive substrates are provided with p-conductive tub-shaped semiconductor zones. The conductivity types of all semiconductor elements and the polarities of all voltages are thereby respectively replaced by those of the opposite type.

The invention also covers such embodiments which derive from FIG. 1 as a result of the following modification. The boundary line B1 between the elements 1 and 2 is omitted, whereby these two elements are now to be interpreted as a n-conductive substrate. Proceeding on this basis, a p-conductive tub-shaped semiconductor zone is now inserted into this n-conductive substrate, the p-conductive semiconductor zone being bounded from the n-conductive substrate by the broken line B2 and containing the circuit elements T1, S1 and 18. The elements T2, T1, S1 and 18 are thereby connected in the same manner as in FIG. 1.

A preferred application of the invention derives for periphery circuits of dynamic semiconductor memories having high packing density which are monolithically integrated with the memory cells.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In an integrated circuit of the type which is constructed in complementary circuit technology, which includes at least one first field effect transistor arranged in a doped semiconductor substrate of a first conductivity type, which includes a tub-shaped semiconductor zone of a second, opposite conductivity type in the substrate connected to a supply voltage, which includes at least one second field effect transistor arranged in the tub-shaped zone, one of the terminals of the at least one first field effect transistor connected to ground, and which includes a substrate bias voltage generator for biasing the pn-junction between the terminal region connected to ground and the substrate in the non-conducting direction, the improvement therein comprising:

a comparator including a first input connected to ground, a second input connected to the substrate bias voltage generator, and an output; and
   an electronic switch connected between the substrate bias voltage generator and ground and including a control input connected to said output of said comparator,
   said electronic switch comprising a field effect transistor integrated on said substrate, including terminal regions of the second conductivity type and a gate as said control input, and
   said comparator including a first series circuit comprising a load element and a first field effect transistor having a low threshold, said first series circuit connected between a supply voltage and ground, said field effect transistor including a gate connected to the substrate bias voltage generator.

2. The improved integrated circuit of claim 1, wherein:
said load element comprises a field effect transistor including a source terminal connected to the supply voltage and a gate connected to the drain terminal.

3. The improved integrated circuit of claim 2, wherein:
said comparator comprises an amplifier stage connected in series with its output, said amplifier stage comprising a second series circuit including a pair of field effect transistors of different channel types, the gates of said field effect transistors connected to the output of the first series circuit, and a further load element, said load element connected to the supply voltage at one end of said second series circuit and the opposite end of said second series circuit connected to said substrate bias voltage generator.

4. A CMOS circuit arrangement comprising:
(a) a semiconductor substrate of a first conductivity type;
(b) a tub-shaped semiconductor well of a second, opposite conductivity type formed in said substrate, said well being coupled to a voltage source;
(c) a first field effect transistor formed in said substrate, said first transistor having a terminal region connected to ground and which forms a pn-junction with said substrate;
(d) a second field effect transistor formed in said well;
(e) a substrate bias voltage generator having an output terminal operatively coupled to said substrate so as to bias said pn-junction in the non-conducting direction; and
(f) an electronic switch connected to said terminal coupled to ground of said first transistor and to said bias voltage generator output terminal, said switch having a driving input which is also coupled to said bias voltage output terminal so that selective switching of said switch couples said bias voltage generator output terminal to ground to eliminate CMOS latch-up effects in said circuit arrangement.

5. The CMOS circuit of claim 4, wherein:
the substrate bias voltage generator is integrated on the semiconductor substrate.

6. The CMOS circuit of claim 4, wherein:
said electronic switch comprises a low threshold field effect transistor having a threshold voltage lower than the forward voltage of said pn-junction and including first and second regions of the second conductivity type spaced apart in said substrate and an insulated gate covering the substrate between said first and second regions, said gate and said first region connected to the substrate bias generator and said second region connected to ground.

7. The CMOS circuit of claim 6, wherein:
said insulated gate including an insulating layer having a thickness of about 15 nm.

8. The CMOS circuit of claim 4, wherein:
said electronic switch comprises a field effect transistor integrated on said substrate, said transistor including terminal regions of the second conductivity type and a gate as said control input.

9. A CMOS circuit, comprising:
(a) a semiconductor substrate of a first conductivity type;
(b) a tub-shaped semiconductor zone of a second, opposite conductivity type formed in said substrate, said tub-shaped zone being coupled to a supply voltage;
(c) at least one first field effect transistor formed in said substrate, said first transistor having a terminal region connected to ground and a pn-junction between said terminal region and said substrate;
(d) at least one second field effect transistor formed in said tub-shaped zone;
(e) a substrate bias voltage generator having an output operatively coupled to said substrate so as to bias said pn-junction in the non-conducting direction;
(f) a comparator including a first input connected to ground, a second input connected to the substrate bias voltage generator output, and an output; and
(g) an electronic switch connected between the substrate bias voltage generator output and ground and including a control input coupled to said output of said comparator.

10. A CMOS circuit arrangement comprising:
(a) a semiconductor substrate of a p-conductivity type;
(b) a tub-shaped semiconductor zone of an n-conductivity type formed in said substrate, said tub-shaped zone being coupled to a voltage source;
(c) at least one first field effect transistor formed in said substrate, said first transistor having a terminal region which is connected to ground and which forms a pn-junction between said terminal region and said substrate;
(d) at least one second field effect transistor formed in said tub-shaped zone;
(e) a substrate bias voltage generator having an output terminal operatively coupled to said substrate so as to bias said pn-junction in the non-conducting direction; and
(f) an electronic switch connected between ground and said bias voltage generator output terminal, said switching having a driving input which is also coupled to said bias voltage generator output terminal so that selective switching of said switch couples said bias voltage generator output terminal to ground to eliminate CMOS latch-up effects in said circuit arrangement.

11. The CMOS circuit of claim 10, wherein:
said electronic switch comprises a low threshold field effect transistor having a threshold voltage lower than the forward voltage of said pn-junction and including first and second regions of the second conductivity type spaced apart in said substrate and in insulated gate covering the substrate between said first and second regions, said gate and said first region connected to the substrate bias generator and said second region connected to ground.

12. A CMOS circuit arrangement comprising:
(a) a semiconductor substrate of an n-conductivity type;
(b) a tub-shaped semiconductor well of a p-conductivity type formed in said substrate, said tub-shaped well being coupled to a voltage source;
(c) at least one first field effect transistor formed in said substrate, said first transistor having a terminal region which is connected to ground and which forms a pn-junction between the terminal region and said substrate;

(d) at least one second field effect transistor formed in said well;
(e) a substrate bias voltage generator having an output terminal operatively coupled to said substrate so as to bias said pn-junction in the non-conducting direction; and
(f) an electronic switch connected between ground and said bias voltage generator output terminal, said switch having a driving input which is also coupled to said bias voltage generator output terminal so that selective switching of said switch couples said bias voltage generator output terminal to ground to eliminate CMOS latch-up effects in said circuit arrangement.

13. The CMOS circuit of claim 12, wherein:
said electronic switch comprises a low threshold field effect transistor having a threshold voltage lower than the forward voltage of said pn-junction and including first and second regions of the second conductivity type spaced apart in said substrate and in insulated gate covering the substrate between said first and second regions, said gate and said first region connected to the substrate bias generator and said second region connected to ground.

14. A CMOS circuit arrangement comprising:
(a) a semiconductor substrate of a first conductivity type, said substrate being connected to a supply voltage and having a terminal region connected to ground, said substrate including a pn-junction between said terminal region connected to ground and said substrate;
(b) a tub-shaped zone of a second conductivity type formed in said substrate, said tub-shaped zone including a first field effect transistor formed therein;
(c) a second field effect transistor formed in said substrate, said second field effect transistor including said terminal region connected to ground;
(d) a substrate bias voltage generator for biasing the pn-junction between the terminal region of the substrate connected to ground and the tub-shaped semiconductor zone in the non-conducting direction; and
(e) an electronic switch connected to the terminal region of the substrate which is connected to ground and connected to and driven by the substrate bias voltage generator.

15. The CMOS circuit of claim 14, wherein:
said electronic switch comprises a low threshold field effect transistor having a threshold voltage lower than the forward voltage of said pn-junction and including first and second regions of the second conductivity type spaced apart in said substrate and in insulated gate covering the substrate between said first and second regions, said gate and said first region connected to the substrate bias generator and said second region connected to ground.

* * * * *